United States Patent
Mitchell

(10) Patent No.: US 9,554,481 B1
(45) Date of Patent: Jan. 24, 2017

(54) BAY RAM FIVE

(76) Inventor: Paul Andrew Mitchell, Seattle, WA (US)

( * ) Notice: Subject to any disclaimer, the term of this patent is extended or adjusted under 35 U.S.C. 154(b) by 496 days.

(21) Appl. No.: 13/506,475

(22) Filed: Apr. 18, 2012

Related U.S. Application Data

(60) Provisional application No. 61/517,480, filed on Apr. 20, 2011.

(51) Int. Cl.
  *G06F 1/16* (2006.01)
  *H05K 5/02* (2006.01)

(52) U.S. Cl.
  CPC ............ *H05K 5/0256* (2013.01); *G06F 1/1601* (2013.01)

(58) Field of Classification Search
  USPC ......... 711/6, 114; 370/208, 480, 461, 395.1, 370/389, 392; 455/3.05, 3–1, 424, 7, 455/67.11, 68, 550.1, 556.1, 557, 90.2, 455/413; 345/582, 426, 428, 421, 163, 345/168, 82, 102, 107, 73, 157; 361/679.38, 679.48, 679.02, 679.4, 361/679.32, 679.33, 679.41, 679.26, 361/679.56, 679.37, 679.09, 679.27, 361/679.57, 679.43, 679.59; 312/223.2, 312/332.1, 333, 7.2, 215, 219, 221
  See application file for complete search history.

(56) References Cited

U.S. PATENT DOCUMENTS

| | | | |
|---|---|---|---|
| 4,779,029 A * | 10/1988 | Henderson et al. ......... | 315/367 |
| 2006/0290321 A1 * | 12/2006 | Bhogal et al. ............... | 320/128 |

* cited by examiner

*Primary Examiner* — Anthony Haughton

(57) ABSTRACT

Bay RAM Five is a very high-speed solid-state data storage device with 4 independently controlled banks of 4 DDR3 SO-DIMM sockets per bank, 4 industry-standard SATA data connectors, and one 12V input DC power connector, all housed within an enclosure compatible with 5.25" drive bays found in common PC chassis. The 4 controllers are independently switched with jumper blocks, allowing backward- and forward-compatibility with SATA chipsets and add-on controllers transmitting data at various speeds. A separate jumper switches the device's firmware from the 8 b/10 b "legacy frame" to the 128 b/130 b "jumbo frame" now in the PCI-Express 3.0 specification. The 5.25" enclosure has room for 3 40×40 mm cooling fans, either 20 mm or 10 mm thick: fans are powered by 3 fan headers integrated onto the PCB, or a separate power supply installed in the PC chassis.

1 Claim, 1 Drawing Sheet

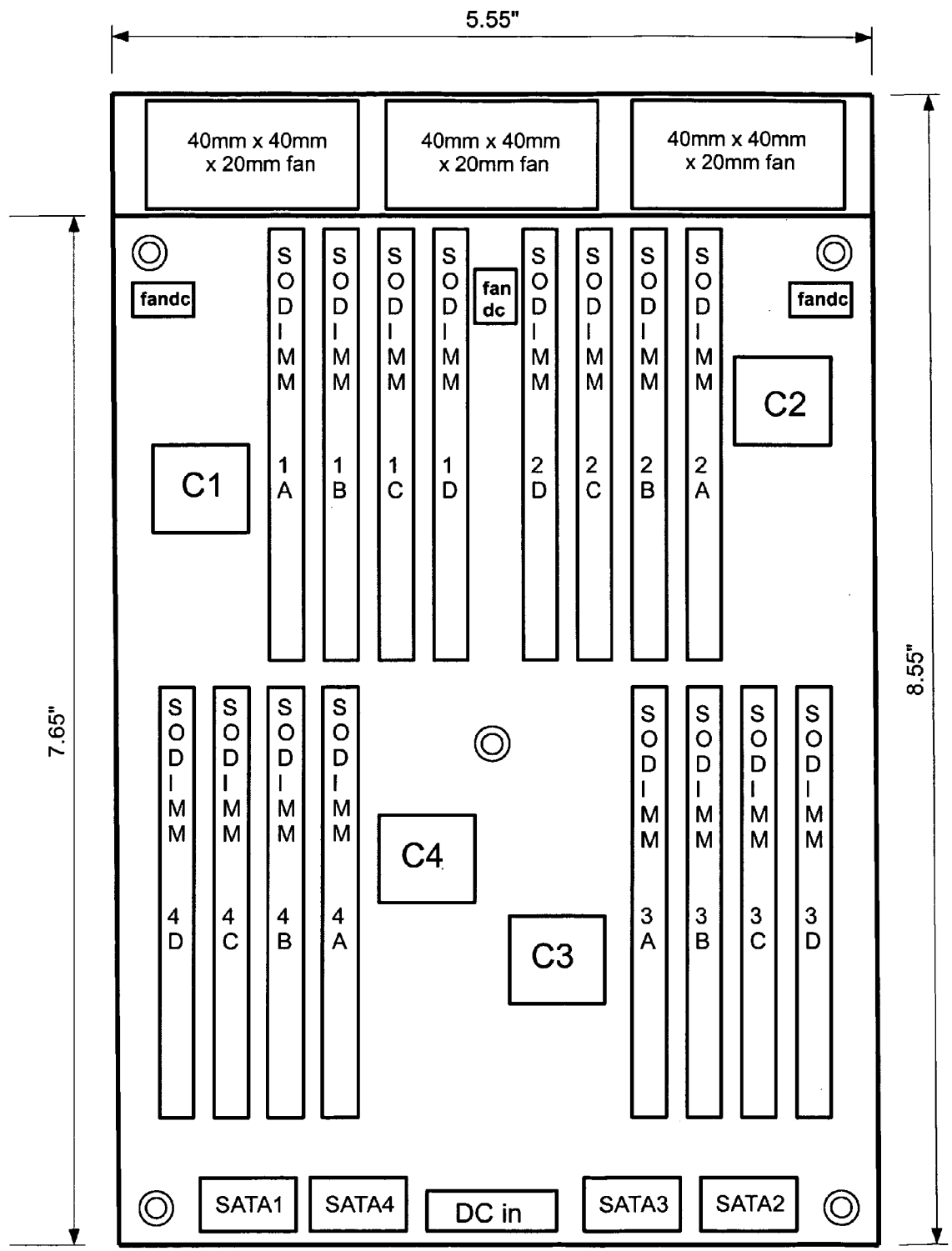

BAY RAM FIVE

CROSS-REFERENCE TO RELATED APPLICATIONS

Provisional Patent Application No. 61/517,480
Filing Date Apr. 20, 2011
(see copy of Filing Receipt attached, Confirmation No. 4109)

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISC APPENDIX digital files on enclosed CD-ROM include:
(1) Drawing 1
    filename: Drawing.1.pdf
(2) Bay RAM Five: Metal Mock-up Assembly Sequence
    filename: Metal.Mock-up.Assembly.Sequence.pdf
(3) "Overclocking Data Storage Subsystems: One Approach to Variable Channel Bandwidth"
    filename: overclocking.storage.subsystems.version.3.pdf
(4) Bay RAM Five: Random Access Memory for 5.25" Drive Bays Annotated Photos: Mock-Up Assembly and Installation Sequence filename: Mock-Up.Assembly.and.Installation.Sequence.pdf

BACKGROUND OF THE INVENTION

This invention pertains to progress in the field of very high-speed solid-state data storage technologies for modern computer systems.
A somewhat theoretical introduction to this invention can be found in the above article which the Inventor authored with the title: "Overclocking Data Storage Subsystems: One Approach to Variable Channel Bandwidth".
In the latter article, see FIG. 3 in particular.
A copy of that article is formally incorporated with this utility patent application, in both hard copy and electronic (.pdf) formats.
The use of Random Access Memory ("RAM") in prior devices previously developed and sold by foreign companies, primarily in Taiwan, were deficient for several reasons including, but not limited to:
(a) use of full-sized dual in-line memory modules ("DIMM") instead of small outline dual in-line memory modules ("SO-DIMM");
(b) use of obsolete double data rate versions 1 and 2 ("DDR" and "DDR2" respectively) instead of modern DDR3 RAM;
(c) use of obsolete transmission rates of 150 and 300 Megabytes per second ("MBps"), instead of the current standard of 600 MBps;
(d) no means to increase transmission rates above 600 MBps;
(e) absence of any means to replace the 8-bit/10-bit ("8 b/10 b") legacy frame with the 128 b/130 b "jumbo frame" now found in the technical specifications for PCI-Express 3.0 as published in November 2010.

BRIEF SUMMARY OF THE INVENTION

Bay RAM Five is the Inventor's unique solution to the problems itemized above. Bay RAM Five is an acronym derived from Random Access Memory for 5.25" drive bays.

Each Bay RAM Five device comprises a unique printed circuit board ("PCB") with room for 16×DDR3 SO-DIMM sockets, and a matching enclosure designed specifically to be geometrically compatible with standard 5.25" drive bays found in billions of Personal Computer ("PC") chassis.
The object of this device is to provide a unique solution for reading and writing computer files that is very fast, solid-state and compatible with wide varieties of both DDR3 SO-DIMMs, and also integrated and add-on controllers that support redundant arrays of independent disks ("RAID") and various RAID "levels" particularly RAID 0 also known as "striping" (for maximum raw bandwidth).
In particular, the use of compatible RAID 0 technologies makes it possible for a single Bay RAM Five device to operate in "quad-channel" mode. This means that four (4) physical SATA transmission channels can be harnessed in parallel for purposes of quadrupling the raw bandwidth that is normally available from a single SATA transmission channel.
Moreover, each Bay RAM Five device comes with four (4) parallel data transmission channels: thus, it is also possible to install two or more Bay RAM Five devices in a single PC chassis and thereby effectively multiply the total number of parallel data channels e.g. so as to operate in 8-channel mode with 2× Bay RAM Five devices (2 devices @ 4 channels), 12-channel mode with 3× such devices (3 devices @ 4 channels), and so on in linear scalable fashion.

BRIEF DESCRIPTION OF THE PCB DRAWING (SEE "DRAWING 1")

This utility patent application initially includes only one drawing, called "Drawing 1" for purposes of this application.
Prior to discussing the feasibility of Bay RAM Five with a qualified, professional Circuit Designer and Project Manager, Inventor discussed the need for a preliminary layout of the PCB with interested friends.
Drawing 1 is the result of that discussion. It shows the major components of the Bay RAM Five PCB, including symbols for each of the following elements:
(a) the green rectangular area shows the outside dimensions of the PCB, in millimeters ("mm");
(b) sixteen (16) vertical SO-DIMM sockets are arranged in four (4) banks of four (4) SO-DIMM sockets per bank;
(c) each bank of 4×SO-DIMM sockets is independently controlled by a dedicated 36-bit controller surface-mounted on the PCB;
(d) at the rear of the PCB are symbols for four (4) standard Serial ATA ("SATA") data cable connectors, and one SATA power cable connector;
(e) at the front of the PCB are symbols for three (3) cooling fans either 40×40×20 mm in size, or 40×40×10 mm in size;
(f) symbols are also shown for three (3) fan headers for connecting cooling fan wires to the PCB, to power each of 3 fans;
(g) at the four corners, and at the geometric center of the PCB, are common symbols for "stand-off" fasteners, and matching screws, to attach the PCB to the matching 5.25" enclosure.
Further to elaborate "Drawing 1" as described above, the Inventor has also assembled and sequenced a set of color photographs in a separate document entitled "Bay RAM Five: Metal Mock-up Assembly Sequence."

The latter document is included in hard-copy printed form and also in electronic (.pdf) format on the enclosed CD-ROM disc.

The latter electronic version permits each photograph to be zoomed in and out, using the Adobe Reader software, in order to examine certain details more closely than is possible with the hard-copy printed version of same.

DETAILED DESCRIPTION OF THE INVENTION

Inventor now attaches and incorporates another document entitled "Bay RAM Five Technical Marketing Analysis (Version 3.1)", by way of partially fulfilling the requirements of this Detailed Description of the Invention, and incorporates same by reference as if set forth fully here. At this time, and before any detailed circuit designs are available, Inventor is able to itemize the following essential components which He expects, with great confidence, to be included in the initial working prototype of Bay RAM Five:

The Printed Circuit Board ("PCB") includes, at a minimum:
(a) four (4) separate banks of 4×SO-DIMM sockets per bank;
(b) all SO-DIMM sockets are the "vertical" type (90 degrees to PCB);
(c) one dedicated controller per SO-DIMM bank, 4 controllers total;
(d) one dedicated data connector per controller, 4 connectors total;
(e) one jumper block per controller, 4 jumper blocks total;
(f) all jumper blocks enable 150, 300, 800 MBps;
(g) all jumper blocks default to 600 MBps, 8 b/10 b "legacy frame";
(h) all jumper blocks enable a future 128 b/130 b "jumbo frame" option;
(i) one 12V input DC power connector, e.g. SATA-, barrel-, or DIN-type;
(j) three (3) fan power headers, 3-pins per fan header;
(k) supplementary surface-mounted chips e.g. capacitors etc.; and,
(l) all fixed, possibly layered traces necessary for routing power, data and control circuits among connectors and surface-mounted chips.

The compatible 5.25" enclosure includes, at a minimum:
(a) 3-D geometry compatible with industry-standard 5.25" drive bays;
(b) four (4) or five (5) "stand-off" fasteners i.e. "mini-motherboard";
(c) room for three (3) 40×40×20 mm or 40×40×10 mm front cooling fans;
(d) separate removable front trim piece, with integrated dust filter;
(e) front trim piece is fastened to enclosure w/ 2 visible screws; and,
(f) side panels are tapped for standard chassis fasteners, or rails.

The invention claimed is:

1. Inventor hereby asserts a single claim that Bay RAM Five is entirely unique and without equal in the global marketplace for computer data storage devices, because it incorporates all of the following features into a single device:
   (a) four (4) independently controlled banks of four (4) DDR3 SO-DIMM sockets per bank are designed fit within the 3-D geometry of an industry-standard 5.25" drive bay, when fully populated with 16× industry-standard DDR3 SO-DIMMs, also known as "laptop RAM";
   (b) four (4) independently controlled banks of four (4) DDR3 SO-DIMM sockets are designed to accommodate up to 16× industry-standard DDR3 SO-DIMMs in capacities up to 16 Gigabytes ("GB") per SO-DIMM (i.e. 64 GB per bank, 256 GB per Bay RAM Five device);
   (c) each of the four (4) independent controllers connects directly to an industry-standard SATA data connector located at the rear (internal) panel of the 5.25" enclosure;
   (d) each of the four (4) independent controllers is optioned with a dedicated jumper block, and with a factory default of 600 MBps and the now standard 8 b/10 b "legacy frame" during data transmission;
   (e) each of those jumper blocks has options for 150 ("1.5 G"), 300 ("3 G") and 800 MBps ("8 G"), to override the factory defaults;
   (f) each of those jumper blocks also has an option to enable the 128 b/130 b "jumbo frame", also to override the "6 G" factory default and to be compatible with published PCI-Express 3.0 specifications;
   (g) a single direct current ("DC") connector is also located at the rear (internal) panel of the 5.25" enclosure, to supply input DC power;
   (h) the latter DC connector ships from the factory either as a standard SATA power connector, or as a "barrel-type" connector popular with flat panel monitors, or as a "DIN-type" connector in order to support higher amperages as needed (yet to be decided); and,
   (i) the enclosure is also unique for accommodating all of the above, with proper fasteners to secure the PCB, room for up to three (3) 40×40 mm cooling fans (either 20 mm or 10 mm thick) at the front, and a custom trim piece with integrated dust filter which attaches very simply to the enclosure's front panel with 2 visible machine screws.

* * * * *